US010901325B2

(12) United States Patent
Gurevich et al.

(10) Patent No.: US 10,901,325 B2
(45) Date of Patent: Jan. 26, 2021

(54) DETERMINING THE IMPACTS OF STOCHASTIC BEHAVIOR ON OVERLAY METROLOGY DATA

(71) Applicant: KLA-TENCOR CORPORATION, Milpitas, CA (US)

(72) Inventors: Evgeni Gurevich, Yokneam Illit (IL); Michael E. Adel, Zichron Ya'akov (IL); Roel Gronheid, Leuven (BE); Yoel Feler, Haifa (IL); Vladimir Levinski, Midgal HaEmek (IL); Dana Klein, Haifa (IL); Sharon Aharon, Hanaton (IL)

(73) Assignee: KLA-Tencor Corporation, Milpitas, CA (US)

( * ) Notice: Subject to any disclaimer, the term of this patent is extended or adjusted under 35 U.S.C. 154(b) by 338 days.

(21) Appl. No.: 15/763,662

(22) PCT Filed: Feb. 27, 2018

(86) PCT No.: PCT/US2018/019793
§ 371 (c)(1),
(2) Date: Mar. 27, 2018

(87) PCT Pub. No.: WO2018/160502
PCT Pub. Date: Sep. 7, 2018

(65) Prior Publication Data
US 2019/0049858 A1 Feb. 14, 2019

Related U.S. Application Data

(60) Provisional application No. 62/591,104, filed on Nov. 27, 2017, provisional application No. 62/464,382, filed on Feb. 28, 2017.

(51) Int. Cl.
G06F 11/30 (2006.01)
G03F 7/20 (2006.01)
(Continued)

(52) U.S. Cl.
CPC .......... *G03F 7/70633* (2013.01); *G01B 11/02* (2013.01); *G01B 2210/56* (2013.01); *H01J 37/28* (2013.01)

(58) Field of Classification Search
CPC .................................................. G03F 7/70633
See application file for complete search history.

(56) References Cited

U.S. PATENT DOCUMENTS 6,921,916 B2 7/2005 Adel et al.
6,985,618 B2 1/2006 Adel et al.
(Continued)

FOREIGN PATENT DOCUMENTS

KR 20160131110 A 11/2016
WO 2019078901 A1 4/2019

OTHER PUBLICATIONS

ISA/KR, International Search Report for PCT/US2018/019793 dated Jun. 8, 2018.
(Continued)

*Primary Examiner* — Phuong Huynh
(74) *Attorney, Agent, or Firm* — Hodgson Russ LLP

(57) ABSTRACT

Methods are provided for designing metrology targets and estimating the uncertainty error of metrology metric values with respect to stochastic noise such as line properties (e.g., line edge roughness, LER). Minimal required dimensions of target elements may be derived from analysis of the line properties and uncertainty error of metrology measurements, by either CDSEM (critical dimension scanning electron microscopy) or optical systems, with corresponding targets. The importance of this analysis is emphasized in view of the finding that stochastic noise may have increased importance with when using more localized models such as CPE (correctables per exposure). The uncertainty error estimation may be used for target design, enhancement of overlay (Continued)

estimation and evaluation of measurement reliability in multiple contexts.

28 Claims, 8 Drawing Sheets

(51) Int. Cl.
  *G01B 11/02* (2006.01)
  *H01J 37/28* (2006.01)

(56) References Cited

U.S. PATENT DOCUMENTS

| | | | |
|---|---|---|---|
| 7,478,019 B2 | 1/2009 | Zangooie et al. | |
| 2003/0223630 A1* | 12/2003 | Adel | G03F 7/70633 |
| | | | 382/145 |
| 2007/0008533 A1 | 1/2007 | Ghinovker | |
| 2013/0042089 A1 | 2/2013 | Vinh et al. | |
| 2013/0179847 A1 | 7/2013 | Hansen | |
| 2014/0316137 A1 | 10/2014 | Inouye et al. | |
| 2014/0379281 A1 | 12/2014 | Pandev | |
| 2017/0010538 A1* | 1/2017 | Hansen | G03F 7/70666 |

OTHER PUBLICATIONS

Adel et al., Impact of stochastic process variations on overlay mark fidelity towards the 5 nm node, Proc. SPIE 10145, Metrology, Inspection, and Process Control for Microlithography XXXI, 1014509, pp. 1-13, Mar. 28, 2017.

Mack, Analytical expression for impact of linewidth roughness on critical dimension uniformity, Journal of Micro/Nanolithography, MEMS, and MOEMS, vol. 13(2), 020501, pp. 1-3, Apr.-Jun. 2014.

* cited by examiner

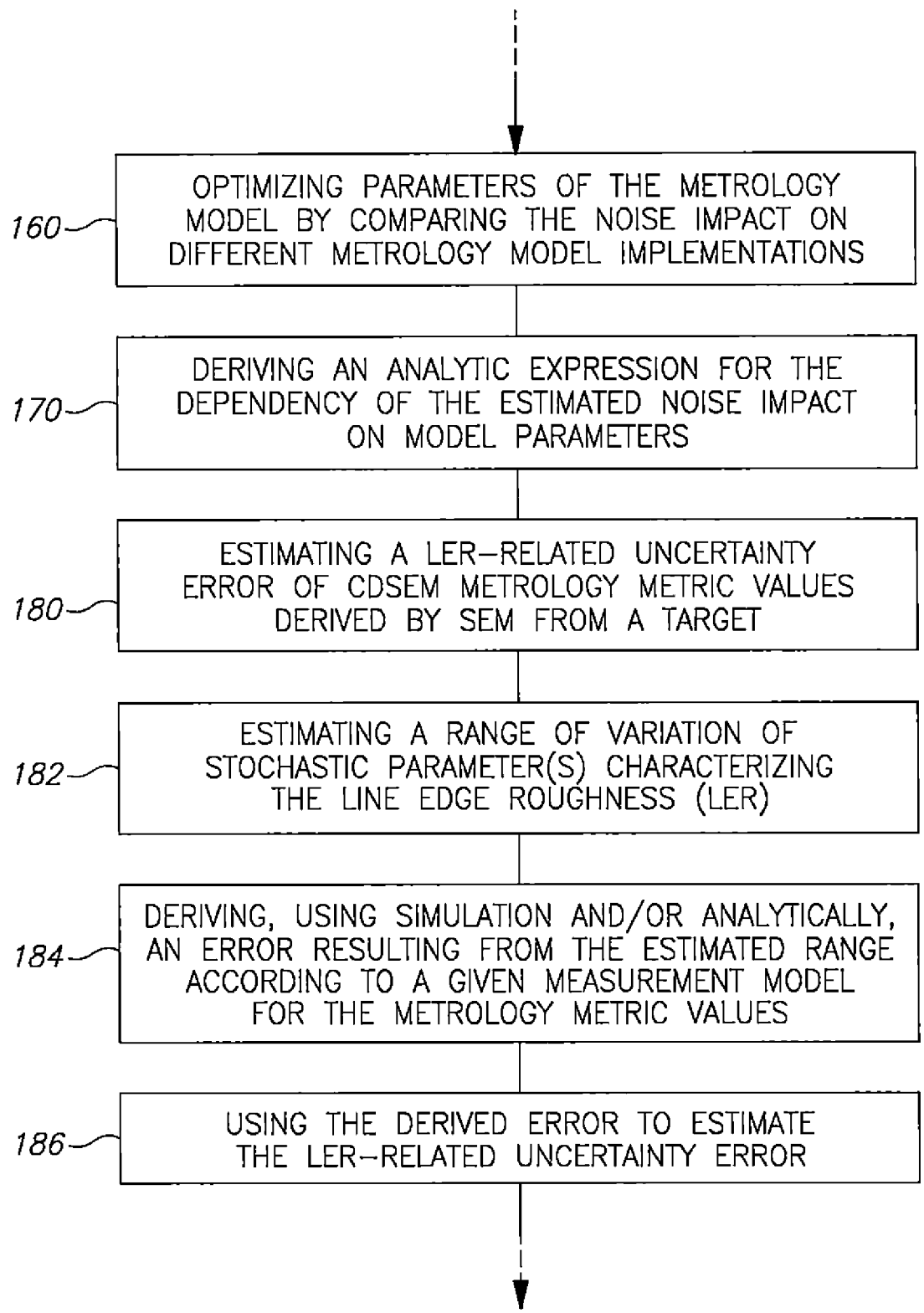
Figure 1 (cont. 1)

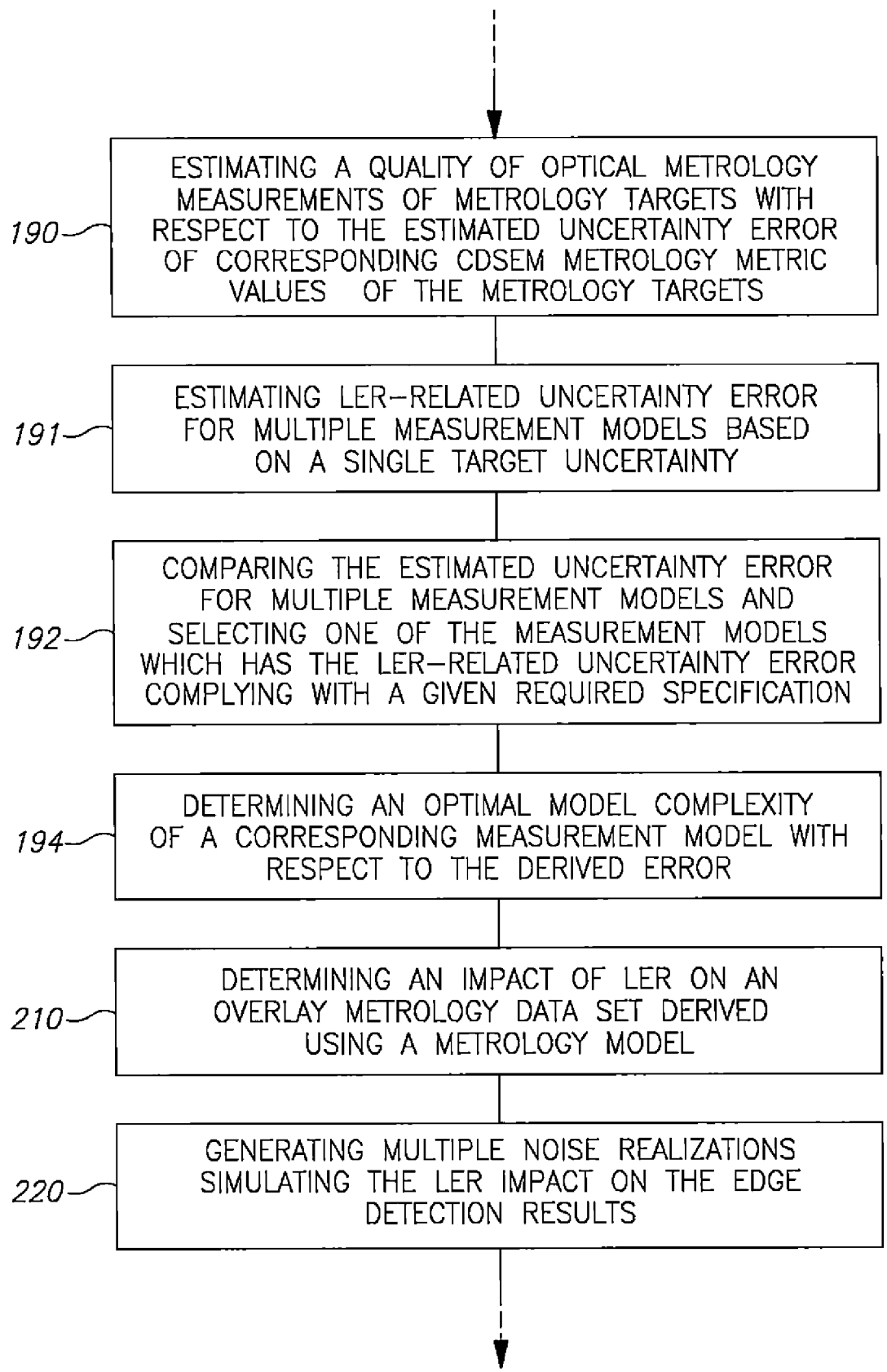
Figure 1 (cont. 2)

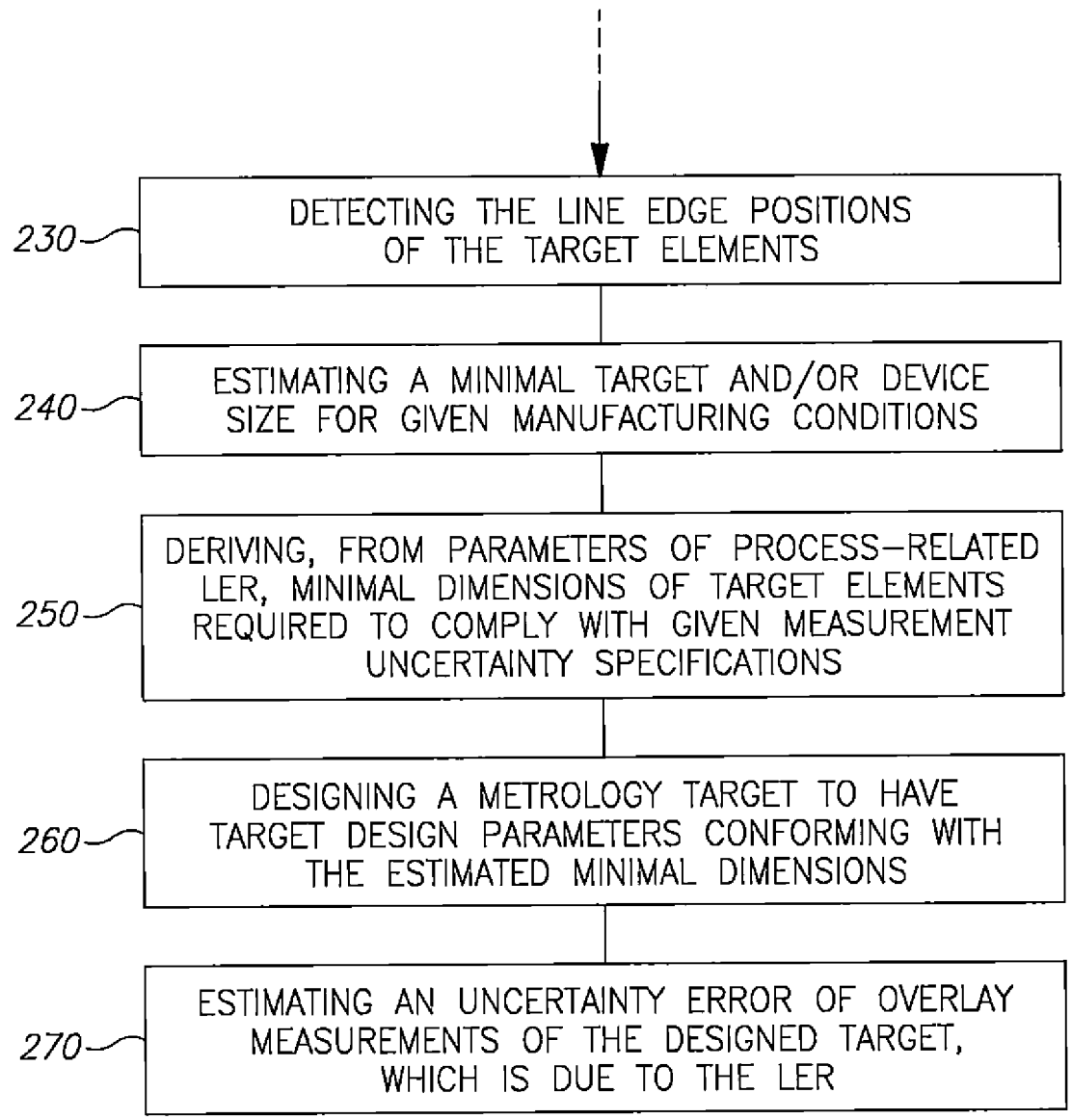
Figure 1 (cont. 3)

DETERMINING THE IMPACTS OF STOCHASTIC BEHAVIOR ON OVERLAY METROLOGY DATA

CROSS REFERENCE TO RELATED APPLICATIONS

This application claims the benefit of U.S. Provisional Patent Application No. 62/464,382 filed on Feb. 28, 2017, which is incorporated herein by reference in its entirety.

BACKGROUND OF THE INVENTION

1. Technical Field

The present invention relates to the field of metrology, and more particularly, to measurement algorithms.

2. Discussion of Related Art

In the field of semiconductor metrology, metrology tools comprise an illumination system which illuminates metrology targets, a collection system which captures relevant information provided by the illumination system's interaction (or lack thereof) with a target, device or feature, and a processing system which analyzes the information collected using one or more algorithms. Metrology tools can be used to measure structural and material characteristics (e.g., material composition, dimensional characteristics of structures and films such as film thickness and/or critical dimensions of structures, overlay, etc.) associated with various semiconductor fabrication processes. These measurements are used to facilitate process controls and/or yield efficiencies in the manufacture of semiconductor dies.

The metrology tool is designed to make many different types of measurements related to semiconductor manufacturing such as characteristics of one or more targets, e.g., critical dimensions, overlay, sidewall angles, film thicknesses, line edge roughness, line width roughness pattern placement errors, or process-related parameters (e.g., focus and/or dose). The targets can include certain regions of interest that are periodic in nature, such as, for example, gratings in a memory die. The metrology targets may possess various spatial characteristics and are typically constructed of one or more cells which may include features in one or more layers which may have been printed in one or more lithographically distinct exposures. The targets or the cells may possess various symmetries such as two-fold or four-fold rotation symmetry and/or reflection symmetry. Examples of such metrology structures are described in U.S. Pat. No. 6,985,618 which is included herein by reference in its entirety. Different cells or combinations of cells may belong to distinct layers or exposure steps. The individual cells may comprise either isolated non-periodic features or alternately they may be constructed from one, two or three dimensional periodic structures or combinations of non-periodic and periodic structures as described in U.S. Patent Application Publication No. 2013/042,089 which is included herein by reference in its entirety. The periodic structures may be non-segmented, or they may be constructed from finely segmented features which may at or close to the minimum design rule of the lithographic process used to print them. The metrology targets may also be collocated or in close proximity with dummification structures in the same layer or in a layer above, below or in between the layers of the metrology structures. Targets can include multiple layers (or films) whose thicknesses can be measured by the metrology tool. Targets can include target designs placed (or already existing) on the semiconductor wafer for use, e.g., with alignment and/or overlay registration operations. Certain targets can be located at various places on the semiconductor wafer. For example, targets can be located within the scribe lines (e.g., between dies) and/or located in the die itself In certain embodiments, multiple targets are measured (at the same time or at differing times) by the same or multiple metrology tools as described in U.S. Pat. No. 7,478,019 which is included herein by reference in its entirety. The data from such measurements may be combined. Data from the metrology tool is used in the semiconductor manufacturing process for example to feed-forward, feed-backward and/or feed-sideways corrections to the process (e.g., lithography, etch) and therefore, might yield a complete process control solution.

SUMMARY OF THE INVENTION

The following is a simplified summary providing an initial understanding of the invention. The summary does not necessarily identify key elements nor limits the scope of the invention, but merely serves as an introduction to the following description.

One aspect of the present invention provides a method comprising: deriving, from parameters of process-related line edge roughness (LER), an estimation of minimal dimensions of target elements required to comply with given measurement uncertainty specifications, and designing a metrology target to have target design parameters conforming with the estimated minimal dimensions, wherein at least one of the deriving and the designing is carried out by at least one computer processor.

One aspect of the present invention provides a method comprising: estimating a LER-related uncertainty error of CDSEM metrology metric values derived by SEM (scanning electron microscope) from a CDSEM (critical dimension scanning electron microscopy) target, by: estimating a range of variation of at least one stochastic parameter characterizing the LER, deriving, analytically and/or using simulation, an error resulting from the estimated range according to a given measurement model for the metrology metric values, and using the derived error to estimate the LER-related uncertainty error, wherein at least one of: the estimating, the deriving and the using is carried out by at least one computer processor.

One aspect of the present invention provides a method comprising: estimating an uncertainty error of optical metrology metric values due to LER by: estimating a range of variation of at least one stochastic parameters characterizing the LER, deriving, analytically or using simulation, an error resulting from the estimated range according to a given measurement model for the metrology metric values, and using the derived error to estimate the uncertainty error, wherein at least one of: the estimating, the deriving and the using is carried out by at least one computer processor.

One aspect of the present invention provides a method comprising: determining an impact of stochastic noise on a given overlay metrology data set, derived from applying a specified metrology model, by: generating a plurality of noise realizations of random synthetic noise, adding the generated noise realizations to the given overlay metrology data set to yield a modified data set, and using at least one metrology metric, comparing metric values for the given overlay metrology data set and for the modified data set, wherein the comparison provides an estimated noise impact on the given overlay metrology data set, and wherein at least one of: the generating, the adding and the comparing is carried out by at least one computer processor.

These, additional, and/or other aspects and/or advantages of the present invention are set forth in the detailed description which follows; possibly inferable from the detailed description; and/or learnable by practice of the present invention.

BRIEF DESCRIPTION OF THE DRAWINGS

For a better understanding of embodiments of the invention and to show how the same may be carried into effect, reference will now be made, purely by way of example, to the accompanying drawings in which like numerals designate corresponding elements or sections throughout.

In the accompanying drawings.

DETAILED DESCRIPTION OF THE INVENTION

Figure 1:
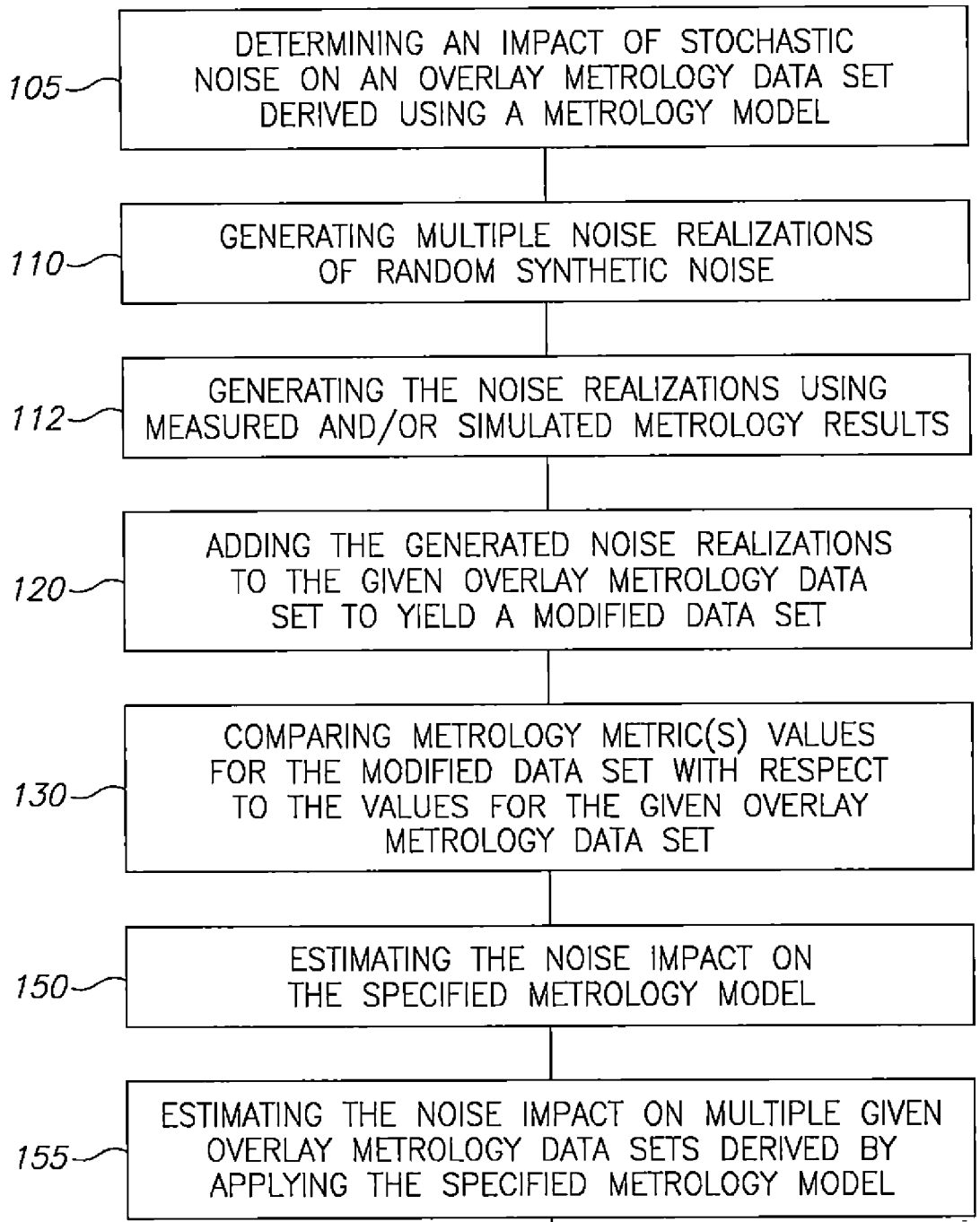
FIG. 1 is a high-level flowchart illustrating a method, according to some embodiments of the invention.

In the following description, various aspects of the present invention are described. For purposes of explanation, specific configurations and details are set forth in order to provide a thorough understanding of the present invention. However, it will also be apparent to one skilled in the art that the present invention may be practiced without the specific details presented herein. Furthermore, well known features may have been omitted or simplified in order not to obscure the present invention. With specific reference to the drawings, it is stressed that the particulars shown are by way of example and for purposes of illustrative discussion of the present invention only, and are presented in the cause of providing what is believed to be the most useful and readily understood description of the principles and conceptual aspects of the invention. In this regard, no attempt is made to show structural details of the invention in more detail than is necessary for a fundamental understanding of the invention, the description taken with the drawings making apparent to those skilled in the art how the several forms of the invention may be embodied in practice.

Before at least one embodiment of the invention is explained in detail, it is to be understood that the invention is not limited in its application to the details of construction and the arrangement of the components set forth in the following description or illustrated in the drawings. The invention is applicable to other embodiments that may be practiced or carried out in various ways as well as to combinations of the disclosed embodiments. Also, it is to be understood that the phraseology and terminology employed herein are for the purpose of description and should not be regarded as limiting.

Unless specifically stated otherwise, as apparent from the following discussions, it is appreciated that throughout the specification discussions utilizing terms such as "processing", "computing", "calculating", "determining", "enhancing", "deriving" or the like, refer to the action and/or processes of a computer or computing system, or similar electronic computing device, that manipulates and/or transforms data represented as physical, such as electronic, quantities within the computing system's registers and/or memories into other data similarly represented as physical quantities within the computing system's memories, registers or other such information storage, transmission or display devices.

Methods are provided for designing metrology targets and estimating the uncertainty error of metrology metric values with respect to stochastic noise such as line properties (e.g., line edge roughness, LER, line width roughness, LWR, and/or Pattern Placement Roughness, PPR). Minimal required dimensions of target elements may be derived from analysis of the line properties and uncertainty error of metrology measurements, by either CDSEM (critical dimension scanning electron microscopy) or optical systems, with corresponding targets. The importance of this analysis is emphasized in view of the finding that stochastic noise may have increased importance with when using more localized models such as CPE (correctables per exposure). The uncertainty error estimation may be used for target design, enhancement of overlay estimation and evaluation of measurement reliability in multiple contexts.

Embodiments of the present invention provide efficient and economical methods and mechanisms for the following issues and thereby provide improvements to the technological field of metrology: Enabling prediction and comparison of the impact of stochastic noise on different overlay models and sample plans; enabling an estimation of the impact of LER, LWR and/or PPR on overlay metrology results from a single target; enabling an estimation of the impact of LER, LWR or Pattern Placement Roughness on overlay metrology correctables given a specific overlay model and sample plan; and/or enabling an estimation of the LER, LWR, PPR or power spectral density (PSD) from an optical image of a test structure, target or device structure.

Disclosed methods (e.g., methods 100 illustrated in FIG. 1 and the examples below) characterize the impact and cross relationship between different measured quantities provided by a metrology sensor and monitor, attenuate and/or prevent prior art uncontrollable effects of stochastic noise (see FIG. 2 below). Moreover, disclosed methods mitigate the prior art risk that the number and spatial distribution of the sampling and/or the area/size of the measurement site/target proves insufficient to the effects of stochastic noise, and enable accuracy verification, post lithography overlay control, and post etch overlay control or lot dispositioning.

Moreover, disclosed methods may be configured to determine the required minimum size of metrology target(s) and/or device structure(s) from which metrology data is obtained under certain manufacturing conditions as determined by measured quantities from same or other metrology target(s) and/or device structure(s).

In certain embodiments, methods 100 may comprise any of: determining the impact of stochastic noise on overlay metrology data set, determining the impact of LER and/or PSD on minimum required target size or measurement area of an optical or SEM based overlay measurement and/or estimating LER/PSD from an optical metrology measurement, as disclosed below.

FIG. 1 is a high-level flowchart illustrating a method 100, according to some embodiments of the invention. The method stages may be carried out with respect to metrology tools and/or modules, which may optionally be configured to implement method 100. Method 100 may comprise the following stages, irrespective of their order.

In certain embodiments, method 100 comprises determining an impact of stochastic noise on a given overlay metrology data set, derived from applying a specified metrology model (stage 105), by generating a plurality of noise realizations of random synthetic noise (stage 110), e.g., using measured and/or simulated metrology results (stage 112), adding the generated noise realizations to the given overlay metrology data set to yield a modified data set (stage 120), and using at least one metrology metric, comparing metric values for the given overlay metrology data set and for the modified data set (stage 130). Comparison 130 may be used to provide an estimated noise impact on the given overlay metrology data set. In certain embodiments, the magnitude of the random noise may be varied to observe the impact on metrology metrics such as the 3sigma of the result, and the corresponding metric(s) may be compared for different models—to estimate any of a minimum sample plan and a maximum tolerable stochastic noise for each overlay correctable control model and/or a resulting uncertainty specification for the specified metrology model. In certain embodiments, an analytical expression for the 3sigma or other metric(s) may be derived at least for some specific (e.g., linear) wafer/field term models. For linear models, probably a kind of equipartition of the noise can be anticipated.

Method 100 may further comprise estimating the noise impact on the specified metrology model (stage 150) by estimating the noise impact on multiple given overlay metrology data sets derived by applying the specified metrology model (stage 155).

Method 100 may further comprise optimizing parameters of the specified metrology model by comparing the noise impact on the specified metrology model, implemented with different parameter values (stage 160). Method 100 may further comprise deriving an analytic expression for the dependency of the estimated noise impact on model parameters (stage 170). Model parameters may comprise, e.g., at least a sample size, a maximum tolerable stochastic noise and/or a resulting uncertainty specification for the specified metrology model.

Any of the stages of method 100, e.g., generating 110, adding 120 and comparing 130, may be carried out by at least one computer processor. Method 100 may be at least partially implemented by at least one computer processor, e.g., in a metrology module. Certain embodiments comprise computer program products comprising a computer readable storage medium having computer readable program embodied therewith and configured to carry out the relevant stages of method 100. Certain embodiments comprise metrology module(s) which comprise elements of the disclosed computer program products.

Disclosed embodiments of methods 100 overcome and/or control prior art risks due to intrinsic stochastic noise per-target and its effect on calculated metrology metrics, e.g., in current optical or SEM (scanning electron microscopy)-based overlay metrology. Alternatively or complementarily, certain embodiments comprise lower bounds on target element dimensions and/or stochastic noise levels which enable use of noise-sensitive procedures while limiting the impact of stochastic noise on the results, as explained below.

Figure 2:
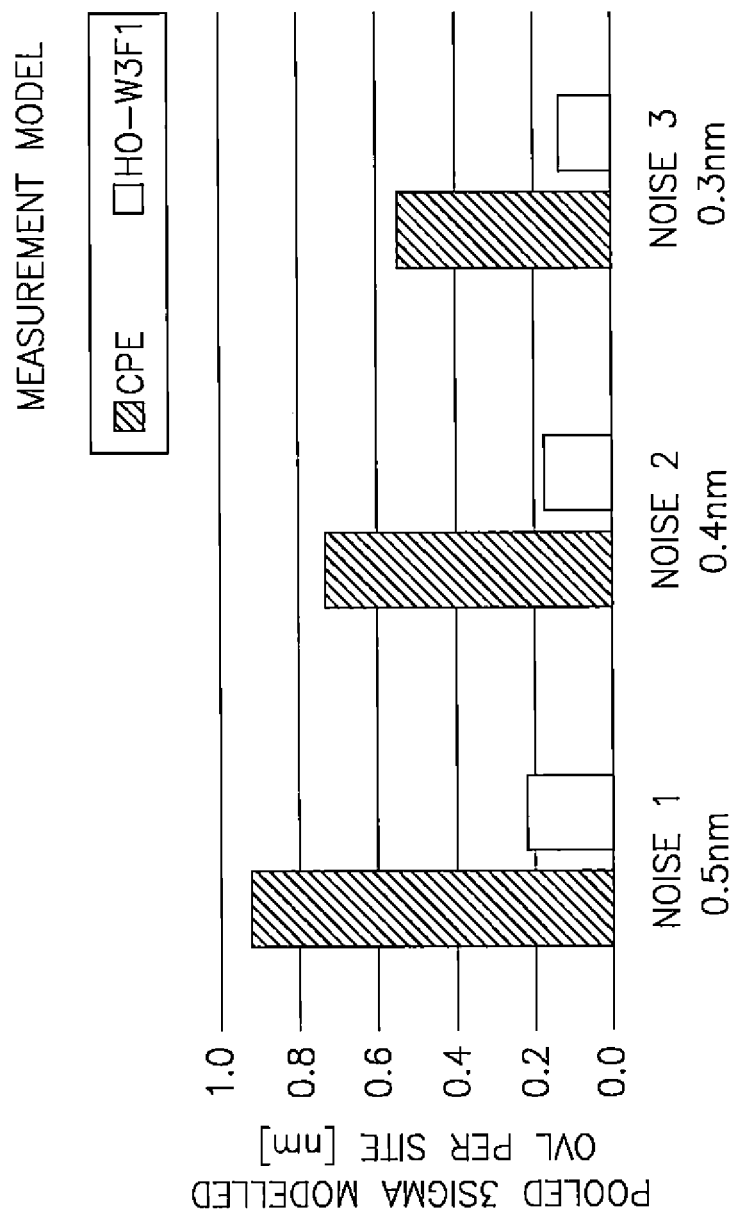
FIG. 2 provides an example for effects of stochastic noise of the OVL measurements on the OVL correctables, according to some embodiments of the invention.

FIG. 2 provides an example for effects of stochastic noise in OVL measurements, according to some embodiments of the invention. FIG. 2 illustrates a non-limiting example of the impact of stochastic variations on the OVL (overlay) correction from the HO (higher order) wafer models in comparison to the impact of stochastic variations on the OVL correction from CPE (correctables per exposure) wafer models, in general terms.

FIG. 2 represents the results of Monte Carlo simulations of the effect of the random noise added to the measured/simulated OVL values on ca. 550 wafer sites, in terms of the metrology metric pooled3sigma. The simulated noise was independent identically distributed Gaussian noise with three different values of the STD (standard deviation), 0.5 nm, 0.4 nm and 0.3 nm, indicated as Noise1 . . . 3, respectively. For each noise level, the pooled variances of the modeled overlay per site was calculated over 100 realizations both for the HO (W3F1 high order—wafer third order correction and field first order correction) wafer model and the CPE model. The resulting 3-sigma (pooled3sigma) are compared in FIG. 2. It shows that HO-modeled overlay remains much more stable compared to that of the CPE-modeled overlay. Without being bound by theory, the inventors suggest that the higher sensitivity of CPE models to stochastic noise is inherent, because the HO model averages the effect of the noise across the entire wafer (e.g., ca. 550 sites), while the CPE model treats every field independently (e.g., ca. 9 sites), which results in higher variation of the modeled OVL variance. The resulting 3Sigma variations, $3\sigma_{mod}$ can be estimated in terms of the variance of the original noise $\sigma_{Noise}$, the number of the sites per fit $N_{site}$ and the number of the model terms $N_{terms}$, as in Equation 1.

$$3\sigma_{mod} \approx 3\sigma_{Noise}\sqrt{\frac{N_{terms}}{N_{sites}}} \quad \text{Equation 1}$$

For example, in the above example $N_{terms}=10$, $N_{sites}=550$ for HO model, and $N_{terms}=3$, $N_{sites}=9$ for the CPE HO model. For Noise1 with $\sigma_{Noise}=0.5$ nm, the above equation predicts $(3\sigma_{mod})_{HO}=0.2$ nm and $(3\sigma_{mod})_{CPE}=0.87$ nm, which agrees with the results of the numerical Monte Carlo simulation in FIG. 2.

As illustrated in the example above, when correction per exposure models and control techniques are used in overlay metrology, the presence of random (stochastic) noise can have a detrimental effect on the fidelity of the correctables generated from the overlay data. Additional analysis is provided in Adel at al. 2017, Impact of stochastic process variations on overlay mark fidelity "towards the 5 nm node", Proc. SPIE 10145, Metrology, Inspection, and Process Control for Microlithography XXXI, 1014509, which is incorporated herein by reference in its entirety.

The example in FIG. 2 demonstrates that the industry transition from HO wafer-level models to CPE field-level models, or to any other model which drastically increases the ratio of number of the correctables to the number of sites from which the model terms are determined, leads to a higher and critical impact of the individual (overlay) mark fidelity or uncertainty on the correctable terms.

In certain embodiments, method 100 further comprises estimating a LER-related uncertainty error of CDSEM metrology metric values derived by SEM from a target (stage 180) by estimating a range of variation of stochastic parameter(s) characterizing the LER (or LWR or other parameters) (stage 182), deriving, e.g., using simulation and/or analytically, an error resulting from the estimated range according to a given measurement model for the metrology metric values (stage 184) and using the derived error to estimate the LER-related uncertainty error (stage 186). Certain embodiments comprise estimating a quality of optical metrology measurements of metrology targets with respect to the estimated uncertainty error of corresponding CDSEM metrology metric values of the metrology targets (stage 190). For example, in case the CDSEM measurements have an inaccuracy of e.g., several 0.1 nm, it may be taken into account when comparing the optical measurements to the CDSEM measurement.

Certain embodiments comprise estimating LER-related uncertainty error for multiple measurement models based on a single target uncertainty (sage 191). In certain embodiments, method 100 further comprises comparing the estimated uncertainty error for multiple measurement models and selecting one of the measurement models which has the LER-related uncertainty error complying with a given required specification (stage 192), for example, the multiple measurement models comprise at least HO and CPE models. In certain embodiments, method 100 further comprises determining an optimal model complexity of a corresponding measurement model (e.g., the number of parameters in CPE) with respect to the derived error (stage 194).

In certain embodiments, method 100 may be applied to optical overlay measurements with respect to the corresponding measurement model (stage 195), and along similar lines as disclosed above, e.g., in stages 182-194.

Advantageously, disclosed method 100 overcomes prior art shortcoming of performing overlay metrology measurements without achieving the minimum desirable uncertainty or fidelity in the data source due to either under-sampling or intrinsic stochastic noise in the image or scatterometry data used for overlay metrology.

As a non-limiting example for implementing methods 100, cases of estimation of the LER, LWR, PSD and other stochastic characteristics of edges of manufactured features are presented below, focusing on LER as the leading non-limiting example. In particular, method 100 comprises the determination of these and/or corresponding parameters on the minimum required target size or measurement area of an optical or SEM based overlay measurement. Embodiments of methods 100 incorporate these estimators and metrics to predict the impact of the estimated parameters (e.g., LER) on overlay metrology measurement and control parameters using the disclosed approach.

In certain embodiments, method 100 may comprise determining the impact of line edge roughness (LER, as the stochastic noise) on an overlay metrology data set derived using a metrology model (stage 210) by generating multiple noise realizations simulating the impact of the LER on the edge detection results (stage 220) to detect line edge positions of target elements (stage 230) and possibly estimate a minimal target and/or device size for given manufacturing conditions (stage 240).

Certain embodiments comprise segmented overlay targets (as metrology targets), having periodic and segmented structures, with segmentation parameters (as target design parameters) conforming with the estimated minimal dimensions derived by methods 100.

Advantageously, embodiments of disclosed method(s) 100 use results of the LER and its statistical properties such as variance, correlation function, correlation length, or PSD (Power Spectrum Density), derived, e.g., from SEM images to predict the minimum required size(s) of metrology target(s) and/or device structure(s) from which metrology data is obtained under certain manufacturing conditions as determined by measured quantities from the same or from other metrology target(s) or device structure(s). Additional examples are provided in Adel at al. 2017, Impact of stochastic process variations on overlay mark fidelity "towards the 5 nm node", Proc. SPIE 10145, Metrology, Inspection, and Process Control for Microlithography XXXI, 1014509, which is incorporated herein by reference in its entirety.

In the following, a detailed non-limiting example for determining of the minimal required target size based on the statistical properties of the LER is provided. Initially, the target bar edge contours are extracted from the SEM image by an edge-detection algorithm and the extracted contours are used to analyze the LER properties (see FIG. 4B as a non-limiting example). It is noted that the edge-detection algorithm may be the same or be performance-wise equivalent algorithm as is used for the edge extraction for the OVL/Registration metrology purposes. The metrology target (also termed below—the metrology mark, and see FIG. 3A for a non-limiting example) may comprise, in a non-limiting example, structural elements with parallel edges. The metrological objective, or part of it, is to determine the average position X, of the edges along the direction perpendicular to the edges. Method 100 comprises algorithms for geometries other than the parallel line structure, which may e.g., be derived from the algorithm presented below straightforwardly.

Figures 3A, 3B, 3C:
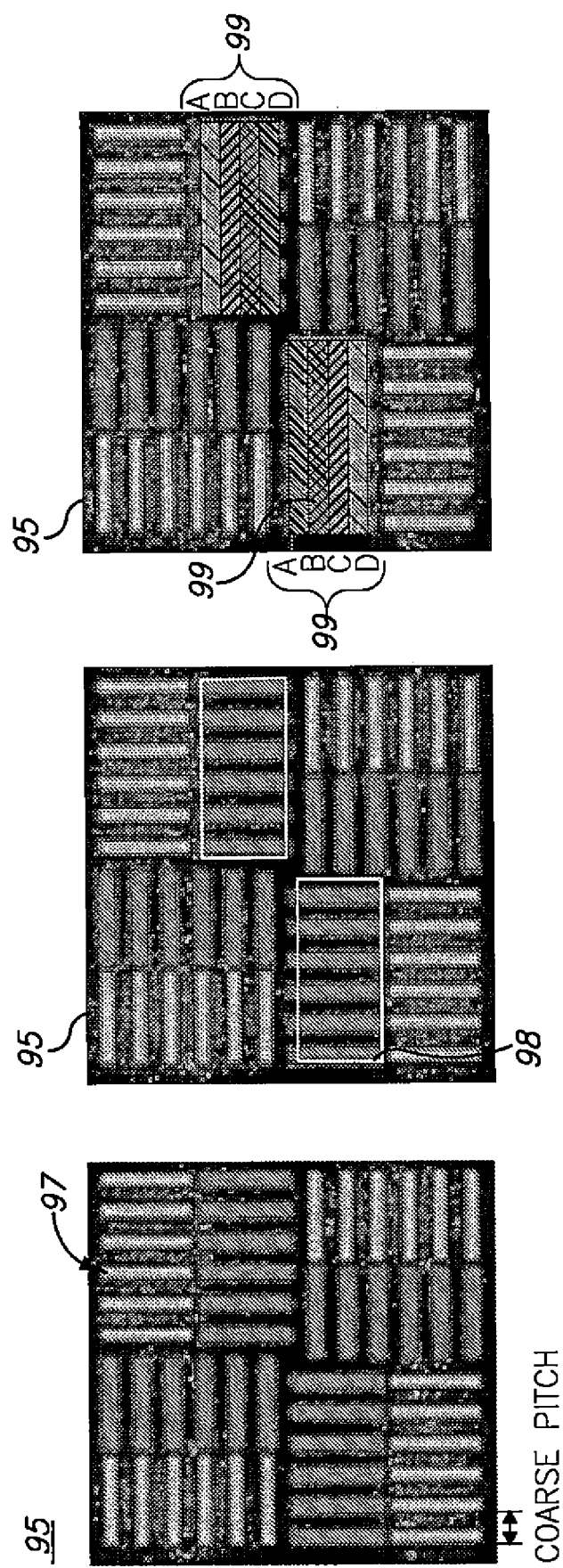
FIGS. 3A-3C illustrate images of the OVL metrology targets having periodic structures with parallel edges, with schematic illustration for calculating a metrology metric therefrom, according to some embodiments of the invention.

FIGS. 3A-3C illustrate image of metrology target 95 having periodic structures with parallel edges 97, with schematic illustration for calculating a metrology metric therefrom, according to some embodiments of the invention. FIG. 3A illustrates metrology target 95. The periodic structures of targets 95 are characterized by a coarse pitch, and may be further segmented by a fine segmentation pitch into finer periodic structures, composed of target elements (see e.g., FIGS. 4A and 4C). The fine segmentation increases the effect of line edge characteristics, as explained and analyzed below. FIG. 3B illustrate regions of interest (ROIs) 98 defined on targets 95. FIG. 3C provides an example for the calculation of kernel3sigma (K3S) as a non-limiting example for a metrology metric, the K3S metric indicating the mark (target) fidelity.

Imaging Based Overlay (IBO) relies on the determination of the center of symmetry $X_c$ of the images of the structures (e.g., periodic grating) constituting the overlay mark, FIG. 3B (for the details see U.S. Pat. No. 6,921,916 and U.S. Patent Application Publication No. 20070008533, incorporated herein by reference in their entirety). This center of symmetry can be found by looking for the maximum of the auto-convolution function of the image. The region of interest (ROI) 98 shown in FIG. 3B selects the part of the structure in the given process layer (e.g., a resist layer) designated for the overlay measurement in x-direction. The selected image area is projected on the x-axis by averaging over the transverse y-direction to produce a one-dimensional (1D) "kernel". As a non-limiting method, the center of the symmetry of this kernel can be found as a maximum of its auto-convolution. The corresponding procedure is then repeated for the second process layer (e.g., the previous layer), to eventually find the overlay between the two.

The K3S measure is introduced in order to characterize the non-uniformity of the overlay mark (as described in WIPO Application No. PCT/US2017/057767, incorporated herein by reference in its entirety). The nominal ROI (FIG. 3B) 98 is subdivided into N (typically ca. 5-10) sub-ROI's 99 as shown in FIG. 3C, which are paired symmetrically (indicated by corresponding letters A, B, C, D in FIG. 3C). Each sub-region 99 is used to find its own center of the symmetry, which yields N values denoted $\{X_c^i\}_{i=1}^N$, the variance of which defines the K3S, namely K3S=3·STD $(X_c^i)$.

Figure 4B:
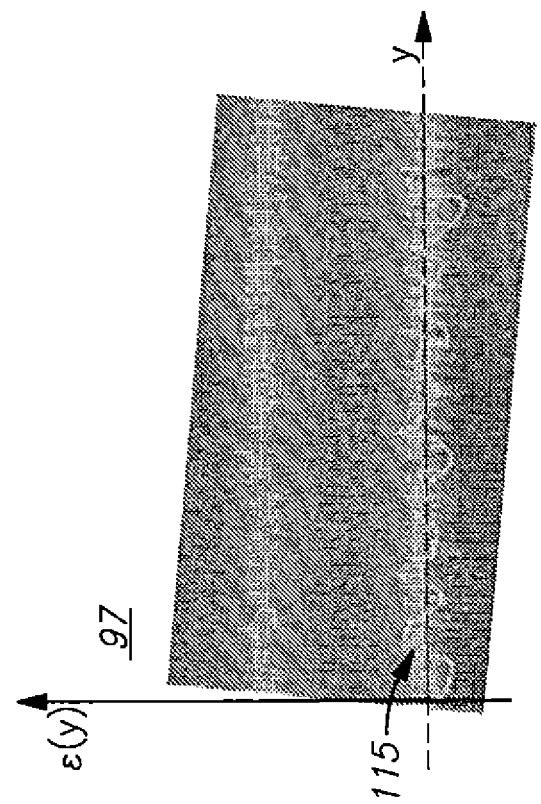
FIG. 4B is a non-limiting example for defining an edge function $\epsilon(y)$ for a line edge (edge contour curve), according to some embodiments of the invention.
Figure 4A:
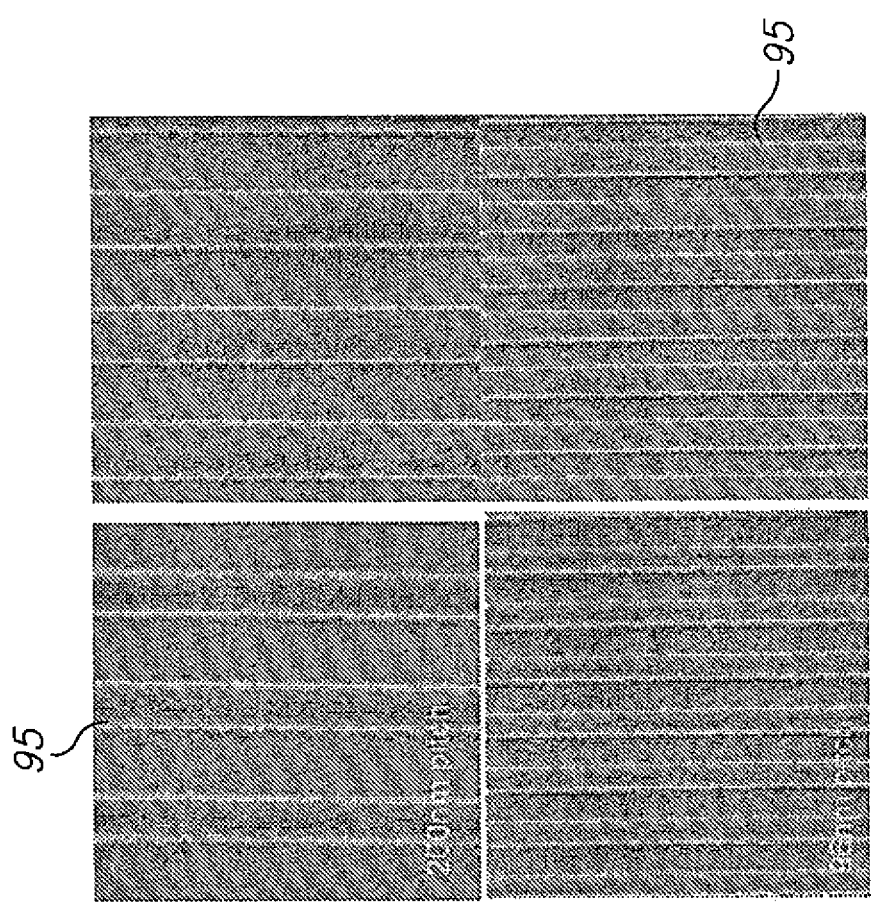
FIGS. 4A illustrates the line edge roughness on the CDSEM image and different segmentations of the lithographic line-space pattern, according to some embodiments of the invention.
Figure 4C:
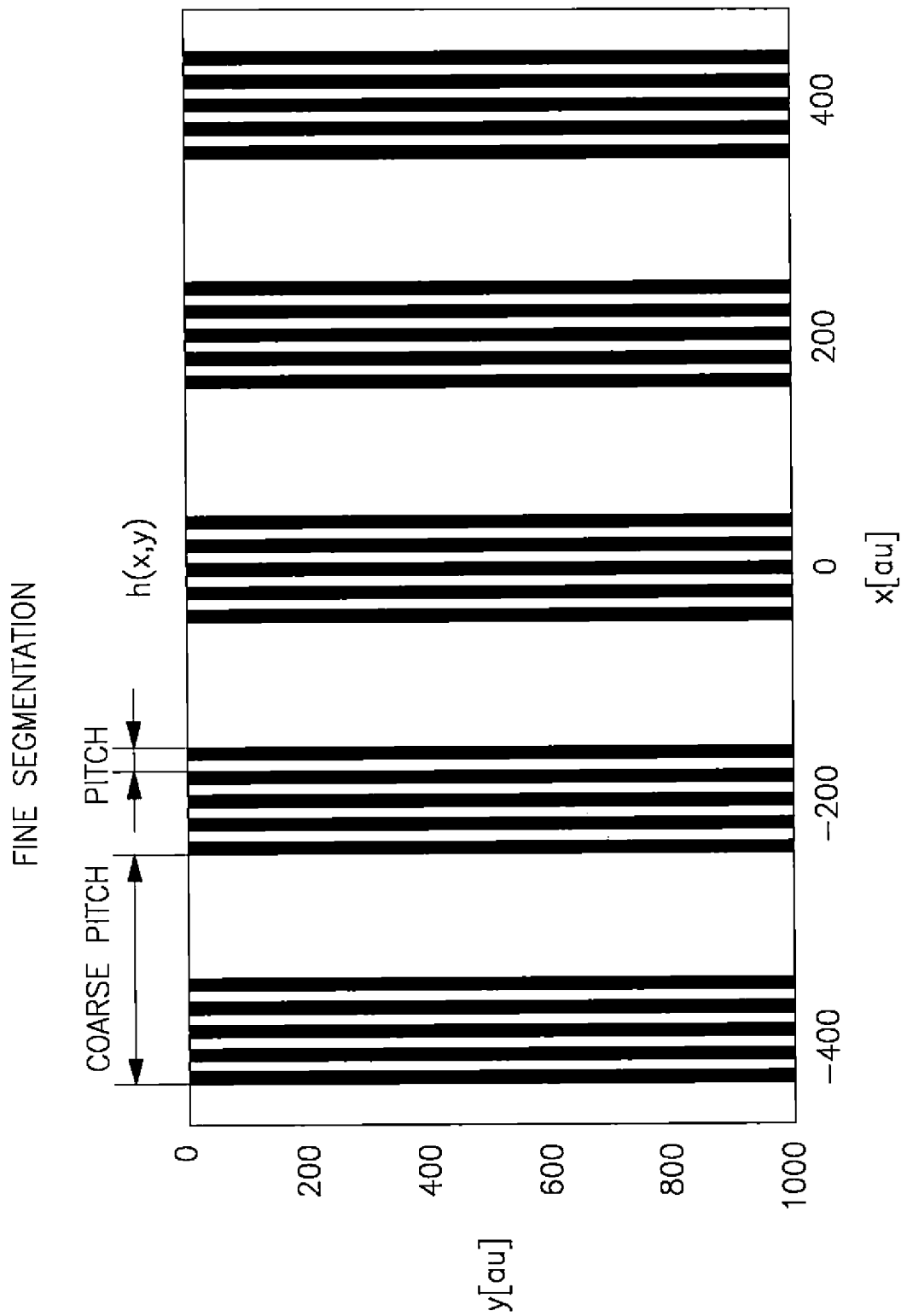
FIG. 4C is a schematic non-limiting example of the periodic structure with coarse pitch and the fine pitch segmentation.

FIGS. 4A-4C illustrate a non-limiting example for a SEM image of a metrology target 95 having periodic structures with parallel edges 97, according to some embodiments of the invention. FIGS. 4A illustrates the line edge roughness on the CDSEM image and different segmentations of the lithographic line-space pattern, according to some embodiments of the invention. FIG. 4B is a non-limiting example for defining an edge function $\epsilon(y)$ for a line edge (edge contour curve), according to some embodiments of the invention. FIG. 4C is a schematic non-limiting example of the periodic structure with coarse pitch and the fine pitch segmentation.

FIG. 4B is a non-limiting example for defining an edge function $\epsilon(y)$ 115 for a line edge 97 (edge contour curve), extracted from the SEM image using some edge detection algorithm, according to some embodiments of the invention. The statistical properties of the LER can be derived from the edge function $\epsilon(y)$. The important and relevant characterization of the LER is given by its correlation function $C(y'-y'') \equiv \langle \epsilon_i(y')\epsilon_j(y'') \rangle$, where $\langle \ldots \rangle$ denote a statistical averaging, the local variance $\sigma_{LER}^2 = C(0)$, and the correlation length $\xi$ extracted from the above correlation function (for further details on the LER properties see, e.g., Chris A. Mack, "Analytical Expression for Impact of Linewidth Roughness on Critical Dimension Uniformity", Journal of Micro/Nanolithography, MEMS, and MOEMS, 13(2), 020501 (2014)).

The LER phenomenon imposes the uncertainty $\sigma_{X_c}$ (the Standard Deviation) on the value of $X_c$ (the average position of edges 97 along the direction perpendicular to the edges, which is a basic constituent of metrology metrics such as the overlay). The relation between the LER properties and $\sigma_{X_c}$ is given below and is proposed to use for the determination of the minimal metrology target size satisfying the requirement of the uncertainty specification provided in Equation 2 (see e.g., stage 240):

$$\sigma_{X_c} \leq \sigma_{spec} \quad \text{Equation 2}$$

For a single line segment i of the length L, its transverse position $x_i$ may be determined as a mean value of its edge function $\epsilon(y)$, defined in e.g., in FIG. 4B—as provided by Equation 3.

$$x_i = L^{-1} \int_0^L dy\, \epsilon_i(y) \quad \text{Equation 3}$$

The corresponding statistical uncertainty a of the transverse position $x_i$ of the edge contour can be expressed in two equivalent ways, as indicated in Equation 4, $$\sigma_x^2(L) = \frac{1}{L^2}\int\int_0^L dy' dy'' C(y'-y'') = \int_{-\infty}^{\infty} dk S(k) \frac{\sin^2 \pi k L}{(\pi k L)^2} \quad \text{Equation 4}$$

in which $C(y'-y'') \equiv \langle \epsilon_i(y')\epsilon_j(y'') \rangle$ is the correlation function of the LER function (assuming stationary process) and S(k) is its corresponding Power Spectrum Density (PSD). Both functions contain the same information and are related by the Fourier transform. They may be obtained by the analysis of the edge contours extracted by the assumption in the edge-detection algorithm. The important parameter is the correlation length $\xi$ which determines the spatial scale of the decay of the correlation function C(y) or, equivalently, the cutoff frequency of the PSD S(k).

In many cases, LER correlation function may be approximated by the exponential form, presented in Equation 5.

$$C(y'-y'') = \sigma_{LER}^2 e^{-|y'-y''|/\xi} \quad \text{Equation 5}$$

(for further details on the LER properties see, e.g., Chris A. Mack, "Analytical Expression for Impact of Linewidth Roughness on Critical Dimension Uniformity", Journal of Micro/Nanolithography, MEMS, and MOEMS, 13(2), 020501 (2014)).

In the special limiting cases specified in Equation 6, the above expressions for $\sigma_x^2(L)$ may be simplified, or approximated as expressed in Equation 6, e.g., using $$\int_{-\infty}^{\infty} dk \frac{\sin^2 \pi k L}{(\pi k L)^2} = \frac{1}{L}.$$

$$\sigma_x^2(L) \approx \begin{cases} C(0) = \sigma_{LER}^2, & L \ll \xi \\ \frac{S(0)}{L} \approx \frac{2\xi}{L} \sigma_{LER}^2, & L \gg \xi \end{cases} \quad \text{Equation 6}$$

In cases that the LER correlation function can be described by the exponential form as in Equation 3, the uncertainty single edge position is given explicitly by Equation 7.

$$\sigma_x^2(L) = \frac{2\xi}{L}\sigma_{LER}^2 \cdot [1 - \frac{\xi}{L}(1 - e^{-L/\xi})] \quad \text{Equation 7}$$

which is consistent with the general limiting expressions in Equation 6.

If metrology mark 95, or a part of it, consists of 2N statistically equivalent edges of the length L each, the uncertainty of their mean position $$X_c = \frac{1}{2N}\sum_{i=1}^{2N} x_i$$

is expressed in Equation 8.

$$\sigma_{X_c}(L, N) = \frac{\sigma_x(L)}{\sqrt{2N}} \quad \text{Equation 8}$$

Using Equation 4, the optimal parameters N, L of the minimal metrology mark may be obtained, as expressed in Equation 9.

$$\frac{\sigma_x(L)}{\sqrt{2N}} \leq \sigma_{spec} \quad \text{Equation 9}$$

In the special case $L \gg \xi$ of Equation 7, the (in general non-trivial) condition on N and L becomes a condition on the product N×L (e.g., the total integral edge length), as expressed in Equation 10.

$$\sqrt{\frac{S(0)}{2NL}} \leq \sigma_{spec} \qquad \text{Equation 10}$$

where $S(0) = 2\xi\sigma_{LER}^2$. This condition provides a minimal required value of the product of the number of the lines N and the line length L:

$$(L \times N)_{min} = \frac{S(0)}{2\sigma_{spec}^2}.$$

The determination of the minimal size of the periodic-structure-target based on the intra-target CD uniformity (CDU, see, e.g., Chris A. Mack, "Analytical Expression for Impact of Linewidth Roughness on Critical Dimension Uniformity", Journal of Micro/Nanolithography, MEMS, and MOEMS, 13(2), 020501 (2014)) may be carried out by relating the CDU to the LER of the two edges of the measured bars.

The single edge position uncertainty can be inferred from the Line Width Uncertainty (LWU) as expressed in Equation 11.

$$\sigma_x(L) = \sqrt{2} \times CDU \qquad \text{Equation 11}$$

Then, the condition on the minimal number of the lines can be expressed as in Equation 12.

$$N \geq \frac{CDU^2}{\sigma_{spec}^2} \qquad \text{Equation 12}$$

here the CDU already contains the information about the length L of the bar (therefore L does not appear explicitly in Equation 12).

The generalization of the above estimation of the minimal required size of the SEM metrology target to the arbitrary target geometry is straightforward.

Certain embodiments comprise estimating a lower bound for an optical metrology measurement (e.g. OVL, K3S etc.) from the LER properties.

In certain embodiments, the LER contribution to the uncertainty of an optical metrology measurement (e.g., OVL, K3S etc.) may be estimated from the LER and/or its PSD. In certain embodiments, the uncertainty of the plane of the symmetry of the symmetric periodic structure may be extracted from the image created by an optical microscope (see FIG. 3A and FIG. 4C for a non-limiting example of such structures). In certain embodiments, for segmented periodic structures such as illustrated in FIG. 4C, the uncertainty $\sigma_{X_c}$ of the position of the plane of the symmetry of the imaged gratings may be expressed by the approximate parametric relation in terms of the LER properties, target design parameters and the optical system properties, as provided in Equation 13.

$$\sigma_{X_c}^2 \approx \sigma_{LER}^2 \left(\frac{2\xi}{L_y}\right) \times \left(\frac{P}{L_x}\right)\left(\frac{CD}{P_{Fine}}\right)\left(\frac{P_c}{P}\right)^2\left(\frac{P_{Fine}}{CD_{Fine}}\right)^2 \qquad \text{Equation 13}$$

In Equation 13, $L_x$, $L_y$ denote the dimensions of the periodic grating, P, CD are the coarse pitch and its CD in the x-direction, $P_{fine}$, $CD_{fine}$ are the fine segmentation pitch and CD (see FIG. 4C), and $P_c$ is the cut-on pitch of the optical MTF (it is assumed here that $P_c/P$ is of the order of unity). Equation 13 relates the uncertainty $\sigma_{X_c}$ to the following factors: ($L_x/P$) being the ratio of the grating length to the coarse pitch expresses the number of the coarse bars; ($CD/P_{Fine}$) being the ratio of the coarse CD to the fine segmentation pitch expresses the number of the fine segmentation lines per one coarse bar; ($P_c/P$) being the ratio of the optics PSF "cutoff" Pitch to the grating Pitch expresses the low-pass effect of the imaging; and ($P_{Fine}/CD_{Fine}$) describes the duty cycle of the fine segmentation which affect the kernel contrast. The uncertainty $\sigma_{X_c}$ of the optical metrology may be used to estimate the lower bound on the target fidelity metric Kernel-3-Sigma (see WIPO Application No. PCT/US2017/057767, incorporated herein by reference in its entirety), and be used as an indicator of the size of errors associated with metrology metrics, as provided e.g., in U.S. Application Publication No. US20140136137, which is incorporated herein by reference in its entirety.

In certain embodiments, method 100 further comprises deriving, from parameters of process-related LER, minimal dimensions of target elements required to comply with given measurement uncertainty specifications (stage 250), designing a metrology target (e.g., segmented overlay targets having periodic and segmented structures) to have target design parameters (e.g., segmentation parameters) conforming with the estimated minimal dimensions (stage 260) and possibly estimating an uncertainty error of overlay measurements of the designed target, which is due to the LER (stage 270), which may serve as a lower bound for metric values such as K3S demonstrated above.

In certain embodiments, an upper bound on LER and/or its PSD may be estimated from optical metrology measurement(s) by extracting LER and/or PSD estimations using given existing high resolution optical image of metrology or device structure. For example, upper bound estimation(s) for LER may be derived from metrology metrics such kernel 3 sigma and/or optical contrast of the target structure by reversing the expression in Equation 13.

Aspects of the present invention are described above with reference to flowchart illustrations and/or portion diagrams of methods, apparatus (systems) and computer program products according to embodiments of the invention. It will be understood that each portion of the flowchart illustrations and/or portion diagrams, and combinations of portions in the flowchart illustrations and/or portion diagrams, can be implemented by computer program instructions. These computer program instructions may be provided to a processor of a general-purpose computer, special purpose computer, or other programmable data processing apparatus to produce a machine, such that the instructions, which execute via the processor of the computer or other programmable data processing apparatus, create means for implementing the functions/acts specified in the flowchart and/or portion diagram or portions thereof.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or portion diagram or portions thereof.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or portion diagram or portions thereof The aforementioned flowchart and diagrams illustrate the architecture, functionality, and operation of possible implementations of systems, methods and computer program products according to various embodiments of the present invention. In this regard, each portion in the flowchart or portion diagrams may represent a module, segment, or portion of code, which comprises one or more executable instructions for implementing the specified logical function(s). It should also be noted that, in some alternative implementations, the functions noted in the portion may occur out of the order noted in the figures. For example, two portions shown in succession may, in fact, be executed substantially concurrently, or the portions may sometimes be executed in the reverse order, depending upon the functionality involved. It will also be noted that each portion of the portion diagrams and/or flowchart illustration, and combinations of portions in the portion diagrams and/or flowchart illustration, can be implemented by special purpose hardware-based systems that perform the specified functions or acts, or combinations of special purpose hardware and computer instructions.

In the above description, an embodiment is an example or implementation of the invention. The various appearances of "one embodiment", "an embodiment", "certain embodiments" or "some embodiments" do not necessarily all refer to the same embodiments. Although various features of the invention may be described in the context of a single embodiment, the features may also be provided separately or in any suitable combination. Conversely, although the invention may be described herein in the context of separate embodiments for clarity, the invention may also be implemented in a single embodiment. Certain embodiments of the invention may include features from different embodiments disclosed above, and certain embodiments may incorporate elements from other embodiments disclosed above. The disclosure of elements of the invention in the context of a specific embodiment is not to be taken as limiting their use in the specific embodiment alone. Furthermore, it is to be understood that the invention can be carried out or practiced in various ways and that the invention can be implemented in certain embodiments other than the ones outlined in the description above.

The invention is not limited to those diagrams or to the corresponding descriptions. For example, flow need not move through each illustrated box or state, or in exactly the same order as illustrated and described. Meanings of technical and scientific terms used herein are to be commonly understood as by one of ordinary skill in the art to which the invention belongs, unless otherwise defined. While the invention has been described with respect to a limited number of embodiments, these should not be construed as limitations on the scope of the invention, but rather as exemplifications of some of the preferred embodiments. Other possible variations, modifications, and applications are also within the scope of the invention. Accordingly, the scope of the invention should not be limited by what has thus far been described, but by the appended claims and their legal equivalents.

What is claimed is:

1. A method comprising:
    deriving, from parameters of process-related line edge roughness (LER), an estimation of minimal dimensions of target elements required to comply with given measurement uncertainty specifications,
    designing a metrology target to have target design parameters conforming with the estimation of minimal dimensions,
    estimating a range of variation of at least one stochastic parameters characterizing the process-related LER,
    deriving, analytically or using simulation, an error resulting from estimating the range of variation according to a given measurement model for the metrology metric values,
    using the error resulting from estimating the range of variation to estimate uncertainty error of overlay measurements of the metrology target, wherein the uncertainty error is due to the process-related LER,
    estimating the uncertainty error for multiple measurement models based on a single target uncertainty, and
    selecting one of the measurement models with the uncertainty error complying with a required specification,
    wherein at least one of the deriving or the designing is carried out by at least one computer processor.

2. The method of claim 1, wherein the metrology target has a periodic structure characterized by the target design parameters.

3. A computer program product comprising a non-transitory computer readable storage medium having computer readable program embodied therewith, the computer readable program configured to carry out the method of claim 1.

4. A metrology module comprising the computer program product of claim 3.

5. A segmented overlay target, having periodic and segmented structures, with segmentation parameters conforming with the estimation of minimal dimensions derived by the method of claim 1.

6. A method comprising:
    estimating a line edge roughness (LER)-related uncertainty error of critical dimension scanning electron microscopy (CDSEM) metrology metric values derived by scanning electron microscope (SEM) from a critical dimension scanning electron microscopy (CDSEM) target, by:
        estimating a range of variation of at least one stochastic parameter characterizing the LER,
        deriving, analytically and/or using simulation, an error resulting from estimating the range of variation according to a given measurement model for the metrology metric values,
        using the error resulting from estimating the range of variation to estimate the LER-related uncertainty error,
        estimating the LER-related uncertainty error for multiple measurement models based on a single target uncertainty, and
        selecting one of the measurement models with the LER-related uncertainty error complying with a required specification,
    wherein at least one of the estimating, the deriving, or the using is carried out by at least one computer processor.

7. The method of claim 6, wherein the multiple measurement models comprise wafer models, wafer and field models and/or field models.

8. The method of claim 7, wherein the multiple measurement models comprise at least highest order (HO) and correctables per exposure (CPE) models.

9. The method of claim 6, further comprising determining a model complexity of a corresponding measurement model with respect to the error resulting from estimating the range of variation.

10. A computer program product comprising a non-transitory computer readable storage medium having computer readable program embodied therewith, the computer readable program configured to carry out the method of claim 6.

11. A metrology module comprising the computer program product of claim 10.

12. A method comprising:
estimating an uncertainty error of optical metrology metric values due to line edge roughness (LER) by:
estimating a range of variation of at least one stochastic parameters characterizing the LER,
deriving, analytically or using simulation, an error resulting from estimating the range of variation according to a given measurement model for the metrology metric values,
using the error resulting from estimating the range of variation to estimate the uncertainty error,
estimating the uncertainty error for multiple measurement models based on a single target uncertainty, and
selecting one of the measurement models with the uncertainty error complying with a required specification,
wherein at least one of the estimating, the deriving, or the using is carried out by at least one computer processor.

13. The method of claim 12, wherein the multiple measurement models comprise wafer models, wafer and field models and/or field models.

14. The method of claim 13, wherein the multiple measurement models comprise at least highest order (HO) and correctables per exposure (CPE) models.

15. The method of claim 12, further comprising determining an optimal model complexity of a corresponding measurement model with respect to the uncertainty error and the required specification.

16. A computer program product comprising a non-transitory computer readable storage medium having computer readable program embodied therewith, the computer readable program configured to carry out the method of claim 14.

17. A metrology module comprising the computer program product of claim 16.

18. A method comprising:
determining an impact of stochastic noise on a given overlay metrology data set, derived from applying a specified metrology model, by:
generating a plurality of noise realizations of random synthetic noise,
adding the plurality of noise realizations to the given overlay metrology data set to yield a modified data set, and
using at least one metrology metric, comparing metric values for the given overlay metrology data set and for the modified data set,
wherein the comparison provides an estimated noise impact on the given overlay metrology data set, and
wherein at least one of the generating, the adding, or the comparing is carried out by at least one computer processor.

19. The method of claim 18, wherein the generation of the plurality of noise realizations is carried out using measured metrology results.

20. The method of claim 18, further comprising estimating the noise impact on the specified metrology model by estimating the noise impact on an uncertainty of multiple given overlay metrology data sets derived by applying the specified metrology model.

21. The method of claim 18, further comprising optimizing a type of the specified metrology model by comparing the noise impact on the specified metrology model to a required uncertainty specification.

22. The method of claim 21, further comprising deriving an analytic expression for a dependency of the estimated noise impact on model parameters.

23. The method of claim 22, wherein the model parameters comprise at least a sample size and a resulting uncertainty specification for the specified metrology model.

24. The method of claim 18, wherein the stochastic noise comprises line edge roughness (LER) properties.

25. The method of claim 23, further comprising detecting line edge positions of target elements.

26. The method of claim 23, further comprising analyzing, statistically, the impact of the LER on edge detection results.

27. A computer program product comprising a non-transitory computer readable storage medium having computer readable program embodied therewith, the computer readable program configured to carry out the method of claim 18.

28. A metrology module comprising the computer program product of claim 27.

* * * * *